US008705879B2

(12) United States Patent
Abdo et al.

(10) Patent No.: US 8,705,879 B2
(45) Date of Patent: Apr. 22, 2014

(54) IMAGE COMPRESSION ACCELERATION USING MULTIPLE PROCESSORS

(75) Inventors: Nadim Y. Abdo, Redmond, WA (US); Voicu Anton Albu, Redmond, WA (US)

(73) Assignee: Microsoft Corporation, Redmond, WA (US)

( * ) Notice: Subject to any disclaimer, the term of this patent is extended or adjusted under 35 U.S.C. 154(b) by 643 days.

(21) Appl. No.: 12/416,791

(22) Filed: Apr. 1, 2009

(65) Prior Publication Data

US 2010/0254616 A1 Oct. 7, 2010

(51) Int. Cl.
*G06K 9/36* (2006.01)

(52) U.S. Cl.
USPC .......... 382/232; 382/173; 382/233; 718/107; 718/102

(58) Field of Classification Search
USPC ......... 382/298, 304, 293, 232, 233, 305, 240, 382/299, 282, 244, 173; 345/505, 501, 543, 345/520, 522, 418, 420, 422, 423, 503, 519, 345/506, 557, 539, 545, 667; 709/208, 231, 709/247, 203; 712/23, 28, 31, 32; 718/102, 718/104, 107; 358/1.13; 348/333.12
See application file for complete search history.

(56) References Cited

U.S. PATENT DOCUMENTS

| | | | | |
|---|---|---|---|---|
| 5,572,676 A * | 11/1996 | Ohnishi | ....................... | 709/250 |
| 6,148,111 A | 11/2000 | Creusere | | |
| 6,625,671 B1 * | 9/2003 | Collette et al. | .................. | 710/52 |
| 6,978,466 B2 | 12/2005 | Kerly | | |
| 7,171,444 B2 | 1/2007 | Deshpande | | |
| 7,365,743 B1 * | 4/2008 | Chen et al. | ..................... | 345/422 |
| 7,614,075 B2 * | 11/2009 | McDowell et al. | ............ | 725/133 |
| 7,870,551 B2 * | 1/2011 | Anand et al. | ....................... | 718/1 |
| 2002/0101932 A1 * | 8/2002 | Montgomery | ........... | 375/240.25 |
| 2004/0261104 A1 | 12/2004 | Gordon et al. | | |
| 2005/0114601 A1 * | 5/2005 | Ramakrishnan | ............... | 711/118 |
| 2005/0235284 A1 * | 10/2005 | Kadashevich | ................ | 718/100 |
| 2006/0168350 A1 * | 7/2006 | Ishiyama et al. | ............... | 709/247 |
| 2006/0195547 A1 | 8/2006 | Sundarrajan et al. | | |
| 2007/0046980 A1 | 3/2007 | Coleman et al. | | |

(Continued)

FOREIGN PATENT DOCUMENTS

EP 0499088 A2 8/1992
KR 10-0657331 B1 12/2006

OTHER PUBLICATIONS

DeGroot et al.(hereafter DeGroot), "Remote Desktop Protocol (RDP)", posted on Internet on Feb. 2007, URL: <-- http://searchenterprisedesktop.techtarget.com/definition/Remote-Desktop-Protocol-RDP-->.*

(Continued)

*Primary Examiner* — Mekonen Bekele
(74) *Attorney, Agent, or Firm* — Henry Gabryjelski; Kate Drakos; Micky Minhas

(57) ABSTRACT

Systems, methods and computer readable media are disclosed for accelerating the compression of images on a multi-processor computer. In an embodiment, an image is divided into a plurality of slices, each slice having the same width as the image. These slices are provided to a work manager that maintains a thread for each processor. The work manager assigns each slice to a thread for processing in an efficient manner (such as the thread corresponding to the first available processor), and when an indication that the slice has been compressed for each slice is received, the work manager assembles the compressed image.

19 Claims, 4 Drawing Sheets

(56) References Cited

U.S. PATENT DOCUMENTS

| | | | |
|---|---|---|---|
| 2007/0064276 A1 | 3/2007 | Park et al. | |
| 2007/0097130 A1 | 5/2007 | Margulis | |
| 2007/0291980 A1* | 12/2007 | Kim et al. | 382/100 |
| 2008/0219349 A1* | 9/2008 | Huang et al. | 375/240.15 |
| 2008/0310555 A1 | 12/2008 | Kee | |
| 2008/0310709 A1* | 12/2008 | Kender | 382/156 |
| 2008/0310739 A1 | 12/2008 | Endo | |
| 2009/0201518 A1 | 8/2009 | Hino | |

OTHER PUBLICATIONS

Remote Desktop Protocol (RDP)—Technical Analysis http://www.itraction.nl/nl/working-online-met-itraction-oplossingen/rdp.html.
Parallel Implementation of Fractal Image Compression http://ieeexplore.ieee.org/stamp/stamp.jsp?arnumber=00658379.
Image-Sequence Compression on a 68020-based Multi-Processor System http://ieeexplore.ieee.org/stamp/stamp.jsp?arnumber=00014962.
"Remote Desktop Protocol (RDP)—Technical Analysis", http://www.itraction.nl/nl/working-online-met-itraction-oplossingen/rdp.html, accessed Dec. 30, 2008, 7 pages.
Moorhead et al., "Image-Sequence Compression On A 68020-Based Multi-Processor System", IEEE International Symposium on Circuits and Systems, Jun. 7-9, 1988, 1, 455-458.
Nge et al., "Parallel Implementation of Fractal Image Compression", Proceedings of 1997 IEEE International Symposium on Consumer Electronics, Dec. 2-4, 1997, 169-172.
PCT Application No. PCT/US2010/029710 : International Search Report and Written Opinion of the International Searching Authority, Nov. 16, 2010, 13 pages.

* cited by examiner

IMAGE COMPRESSION ACCELERATION USING MULTIPLE PROCESSORS

BACKGROUND OF THE INVENTION

Although computers were once isolated and had minimal or little interaction with other computers, today's computers interact with a wide variety of other computers through communications networks, such as Local Area Networks (LANs) and Wide Area Networks (WANs). With the wide-spread growth of the INTERNE™, connectivity between computers is becoming more important and has opened up many new applications and technologies. The growth of large-scale networks, and the wide-spread availability of low-cost personal computers, has fundamentally changed the way that many people work, interact, communicate, and play.

One increasing popular form of networking may generally be referred to as virtual computing systems, which can use protocols such as Remote Desktop Protocol (RDP), Independent Computing Architecture (ICA), and others to share a desktop and other applications with a remote client over a remote session. Such computing systems typically transmit the keyboard presses and mouse clicks or selections from the client to a server, relaying the screen updates back in the other direction over a network connection (e.g., the INTERNET). As such, the user has the experience as if their machine is operating as part of a LAN, when in reality the client device is only sent screenshots of the applications as they appear on the server side.

Compression algorithms are important to reducing the bandwidth used by a remote session to levels that make transmission over LANs, wireless LANs (wLANs) and WANs. These compression algorithms trade processing time on a server in exchange for a lower bandwidth required for the session.

Too high an amount of processing time can inhibit scalability of the server as well as increase the time required to encode a frame, which reduces the overall framerate (FPS) of the remote session. A low FPS negatively impacts the user experience because the session may appeal jerky and feel unresponsive.

Present encoding systems are lacking in ways to take advantage of the multiple processors or processing cores found in many contemporary computers. This lack of maximization of processing resources causes compression time to be higher than it could be.

SUMMARY OF THE INVENTION

In an embodiment, the resources of multiple processors may be taken advantage of through use of a multi-processor (or core) work manager that allocates a physical central processing unit (CPU) thread per core. An image that is to be encoded is divided into a series of slices—rectangular strips that are of the same width as the image. The work manager dynamically balances and allocates work to available cores and collects completion notifications to allow the final compressed images slices to be re-assembled into a coherent compressed image. The work manager dispatches slices to available processors, such as dispatching a slice to the first processor available. The processor to which the slice is dispatched independently compresses the slice. The work manager receives completion notifications for each slice from each respective core and assembles those compressed slices into the compressed image.

By leveraging multiple processors or cores, compression speed is increased. Cache thrashing is reduced by dividing the image and allocating slices of the image to different cores. Various techniques are available for dynamically allocating compression workload of slices to different processors. Corresponding techniques may be implemented to decompress the compressed image.

It can be appreciated by one of skill in the art that one or more various aspects of the disclosure may include but are not limited to circuitry and/or programming for effecting the herein-referenced aspects of the present disclosure; the circuitry and/or programming can be virtually any combination of hardware, software, and/or firmware configured to effect the herein-referenced aspects depending upon the design choices of the system designer.

The foregoing is a summary and thus contains, by necessity, simplifications, generalizations and omissions of detail. Those skilled in the art will appreciate that the summary is illustrative only and is not intended to be in any way limiting.

BRIEF DESCRIPTION OF THE DRAWINGS

The systems, methods, and computer readable media in accordance with this specification are further described with reference to the accompanying drawings in which.

DETAILED DESCRIPTION OF ILLUSTRATIVE EMBODIMENTS

Figure 1:
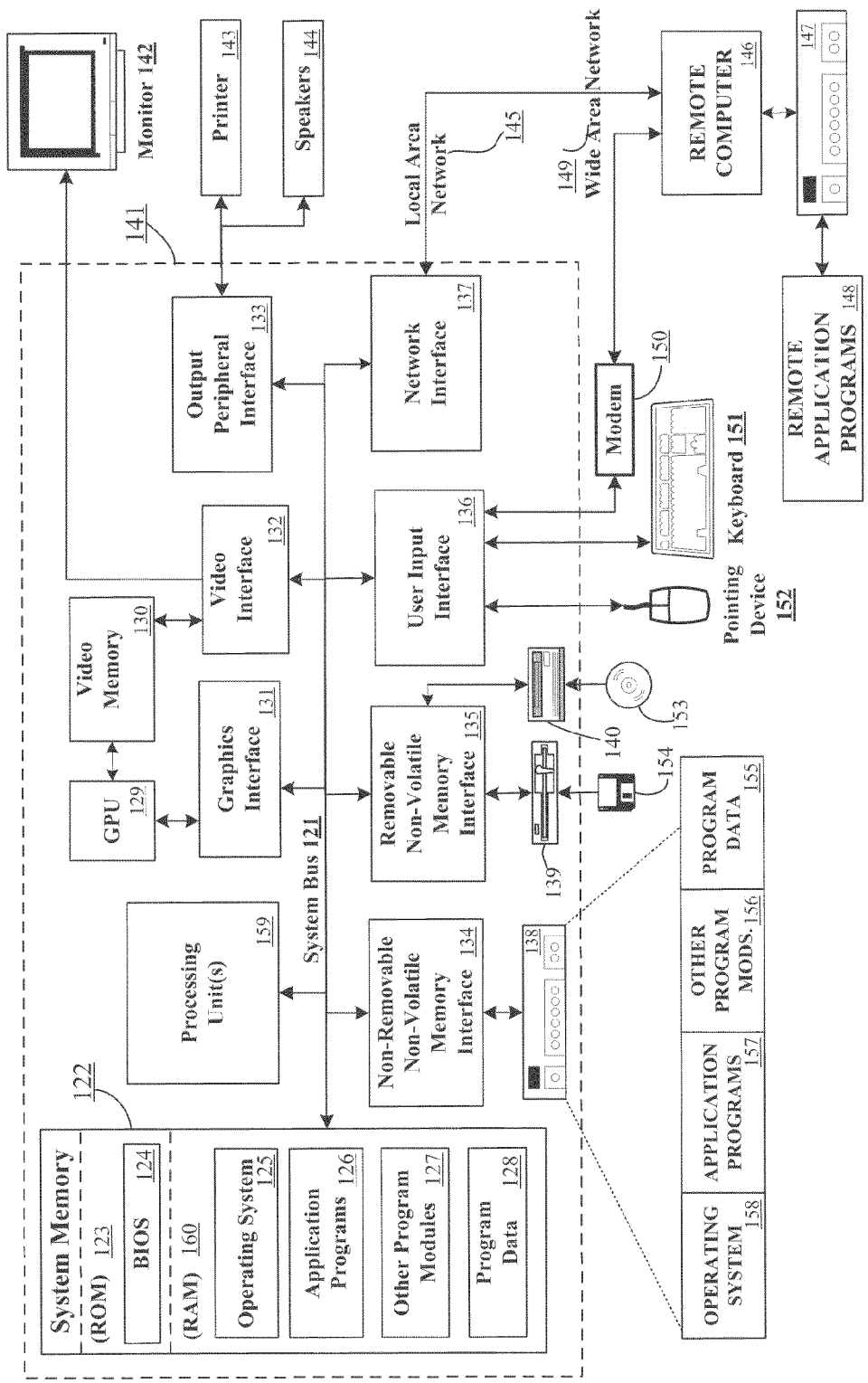
FIG. 1 illustrates an exemplary general purpose computing environment in which in which the multiple-processor image encoding described herein may be embodied.

FIG. 1 is a block diagram of a general purpose computing device in which the techniques described herein may be employed. The computing system environment 120 is only one example of a suitable computing environment and is not intended to suggest any limitation as to the scope of use or functionality of the presently disclosed subject matter. Neither should the computing environment 120 be interpreted as having any dependency or requirement relating to any one or combination of components illustrated in the exemplary operating environment 120. In some embodiments the various depicted computing elements may include circuitry configured to instantiate specific aspects of the present disclosure. For example, the term circuitry used in the disclosure can include specialized hardware components configured to perform function(s) by firmware or switches. In other examples embodiments the term circuitry can include a general purpose processing unit, memory, etc., configured by software instructions that embody logic operable to perform function(s). In example embodiments where circuitry includes a combination of hardware and software, an implementer may write source code embodying logic and the source code can be compiled into machine readable code that can be processed by the general purpose processing unit. Since one skilled in the art can appreciate that the state of the art has evolved to a point where there is little difference between hardware, software, or a combination of hardware/software, the selection of hardware versus software to effectuate specific functions is a design choice left to an implementer. More specifically, one of skill in the art can appreciate that a software process can be transformed into an equivalent hardware structure, and a hardware structure can itself be transformed into an equivalent software process. Thus, the selection of a hardware implementation versus a software implementation is one of design choice and left to the implementer.

Computer 141 typically includes a variety of computer readable media. Computer readable media can be any available media that can be accessed by computer 141 and includes both volatile and nonvolatile media, removable and non-removable media. The system memory 122 includes computer storage media in the form of volatile and/or nonvolatile memory such as read only memory (ROM) 123 and random access memory (RAM) 160. A basic input/output system 124 (BIOS), containing the basic routines that help to transfer information between elements within computer 141, such as during start-up, is typically stored in ROM 123. RAM 160 typically contains data and/or program modules that are immediately accessible to and/or presently being operated on by processing unit 159. By way of example, and not limitation, FIG. 1 illustrates operating system 125, application programs 126, other program modules 127, and program data 128.

The computer 141 may also include other removable/non-removable, volatile/nonvolatile computer storage media. By way of example only, FIG. 1 illustrates a hard disk drive 138 that reads from or writes to non-removable, nonvolatile magnetic media, a magnetic disk drive 139 that reads from or writes to a removable, nonvolatile magnetic disk 154, and an optical disk drive 140 that reads from or writes to a removable, nonvolatile optical disk 153 such as a CD ROM or other optical media. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like. The hard disk drive 138 is typically connected to the system bus 121 through an non-removable memory interface such as interface 134, and magnetic disk drive 139 and optical disk drive 140 are typically connected to the system bus 121 by a removable memory interface, such as interface 135.

The drives and their associated computer storage media discussed above and illustrated in FIG. 1, provide storage of computer readable instructions, data structures, program modules and other data for the computer 141. In FIG. 1, for example, hard disk drive 138 is illustrated as storing operating system 158, application programs 157, other program modules 156, and program data 155. Note that these components can either be the same as or different from operating system 125, application programs 126, other program modules 127, and program data 128. Operating system 158, application programs 157, other program modules 156, and program data 155 are given different numbers here to illustrate that, at a minimum, they are different copies. A user may enter commands and information into the computer 141 through input devices such as a keyboard 151 and pointing device 152, commonly referred to as a mouse, trackball or touch pad. Other input devices (not shown) may include a microphone, joystick, game pad, satellite dish, scanner, or the like. These and other input devices are often connected to the processing unit 159 through a user input interface 136 that is coupled to the system bus, but may be connected by other interface and bus structures, such as a parallel port, game port or a universal serial bus (USB). A monitor 142 or other type of display device is also connected to the system bus 121 via an interface, such as a video interface 132. In addition to the monitor, computers may also include other peripheral output devices such as speakers 144 and printer 143, which may be connected through a output peripheral interface 133.

The computer 141 may operate in a networked environment using logical connections to one or more remote computers, such as a remote computer 146. The remote computer 146 may be a personal computer, a server, a router, a network PC, a peer device or other common network node, and typically includes many or all of the elements described above relative to the computer 141, although only a memory storage device 147 has been illustrated in FIG. 1. The logical connections depicted in FIG. 1 include a local area network (LAN) 145 and a wide area network (WAN) 149, but may also include other networks. Such networking environments are commonplace in offices, enterprise-wide computer networks, intranets and the Internet.

When used in a LAN networking environment, the computer 141 is connected to the LAN 145 through a network interface or adapter 137. When used in a WAN networking environment, the computer 141 typically includes a modem 150 or other means for establishing communications over the WAN 149, such as the Internet. The modem 150, which may be internal or external, may be connected to the system bus 121 via the user input interface 136, or other appropriate mechanism. In a networked environment, program modules depicted relative to the computer 141, or portions thereof, may be stored in the remote memory storage device. By way of example, and not limitation, FIG. 1 illustrates remote application programs 148 as residing on memory device 147. It will be appreciated that the network connections shown are exemplary and other means of establishing a communications link between the computers may be used.

Figure 2:
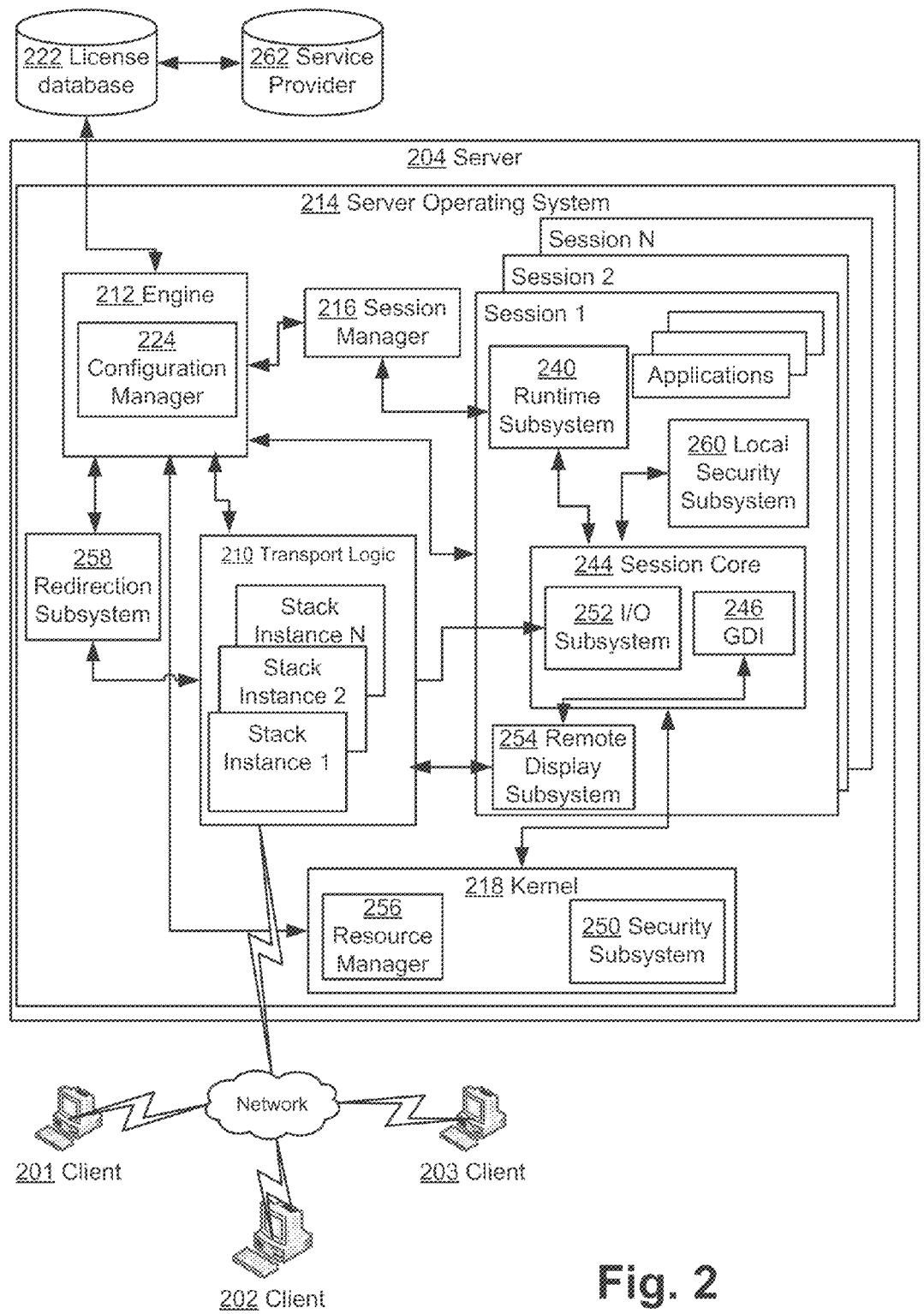
FIG. 2 depicts an operational environment for practicing aspects of the present disclosure.

Referring now to FIG. 2, it generally illustrates an example environment wherein aspects of the present disclosure can be implemented. One skilled in the art can appreciate that the example elements depicted by FIG. 2 provide an operational framework for describing the present disclosure. Accordingly, in some embodiments the physical layout of the environment may be different depending on different implementation schemes. Thus the example operational framework is to be treated as illustrative only and in no way limit the scope of the claims. One skilled in the art can also appreciate that the following discussion is introductory and the elements depicted by FIG. 2 are described in more detail within the discussion of the operational procedures of FIG. 3 through FIG. 8.

Generally, FIG. 2 depicts a high level overview of a terminal server environment that can be configured to include aspects of the present disclosure. In reference to the figure, a server 204 is depicted that can include circuitry configured to effectuate a terminal server and for example, three example clients 201, 202, and 203 (while three clients are depicted the server 204 in embodiments can service more or less clients). The example clients 201-203 can include computer terminals effectuated by hardware configured to direct user input to the server 204 and display user interface information generated by the server 204. In other embodiments, clients 201-203 can be computers that include similar elements as those of computer 20 FIG. 1. In these example embodiments, clients 201-203 can include circuitry configured to effect operating systems and circuitry configured to emulate the functionality of terminals. In these examples one skilled in the art can appreciate that the circuitry configured to effectuate the operating systems can also include the circuitry configured to emulate terminals.

In the depicted example, the server 204 can be configured to generate one or more sessions for connecting clients 201, 202, and 203 such as sessions 1 through N (where N is an integer greater than 1). Briefly, a session in example embodiments of the present disclosure can generally include an operational environment that is effectuated by a plurality of subsystems, e.g., software code, that are configured to effectuate an execution environment and interact with a kernel 218 an operating system 214. For example, a session can include a shell and a user interface such as a desktop, the subsystems that track mouse movement within the desktop, the subsystems that translate a mouse click on an icon into commands that effectuate an instance of a program, etc. In another example embodiment the session can include an application. In this example while an application is rendered, a desktop environment may still be generated and hidden from the user. The session in this example can include similar subsystems as the session described above. Generally, a session can be generated by the server 204 on a user by user basis when, for example, the server 204 receives a connection request over a network connection from a client such as client 201. Generally, a connection request can first be handled by the transport logic 210 that can, for example, be effectuated by circuitry of the server 204. The transport logic 210 can in some embodiments include a network adaptor, firmware, and software that can be configured to listen for connection messages and forward them to the engine 212. As illustrated by FIG. 2, when sessions are generated the transport logic 210 can include protocol stack instances for each session. Generally, each protocol stack instance can be configured to route user interface output to an associated client and route user input received from the associated client to the appropriate session core 244.

As depicted by FIG. 2, during the session generation process the engine 212 can be configured to obtain a license for the session. For example, in one example embodiment the engine 212 can receive a license from the client 201 during the session generation process. In other example embodiments the engine 212 can receive a copy of a license from a license database 222. In some embodiments of the present disclosure the license database 222 can include a relational database management program that can be executed on an operating system of a computer such as computer 20 of FIG. 1. In an example embodiment that includes a license database 222, it can store one or more licenses that can be checked out when a client attempts to obtain a session from the server 204. In another embodiment each license can itself be associated with an account identifier, e.g., a username/password combination, a smartcard identifier, etc., and each license can only be checked out if the correct account identifier is presented. Generally, the number of connections that a server 204 can generate can be dependent upon the number of licensees the entity that controls the server 204 has purchased from a service provider. If for example, the entity has purchased one license, then the server 204 can be configured to only allow one session. In this example if the license is associated with an account identifier, then only a user that presents the correct account identifier can obtain a session.

In example embodiments of the present disclosure each license can be validated by a service provider 262 before they can be used. For example, the service provider 262 can in example embodiments act as a certificate authority that aphorizes and activates licenses and servers. In these embodiments the service provider 262 can ensure that licenses are not stolen, copied, or pirated. The service provider 262 can also ensure that the license are only used by the server 204 they are purchased for by storing a copy of the licenses in a database and associating the licenses with server 204.

As illustrated by FIG. 2, a configuration manager 224 in an example embodiment of the present disclosure can include computer readable instructions that when executed instantiate a process that can receive a license during the session creation process and determine a service level for a newly spawned session by interfacing with various subsystems such as session manager 216. The session manager 216 in an embodiment can be configured to initialize and manage each session by for example, generating a session identifier for a session space; adding the session identifier to a table; assigning memory to the session space; and generating system environment variables and instances of subsystem processes in memory assigned to the session space. As illustrated by FIG. 2, in an embodiment the session manager 216 can instantiate environment subsystems such as a runtime subsystem 240 that can include a kernel mode part such as the session core 244. For example, the environment subsystems in an embodiment can be configured to expose a subset of services to application programs and provide an access point to the kernel 218 of the operating system 214. As illustrated by FIG. 2, in some embodiments the kernel 218 can include a security subsystem 250 and a resource manager 256. In an example embodiment the security subsystem 250 can enforce security policies of the server 204 by, for example, performing runtime object protection. In these embodiments the resource manager 256 in an embodiment can create and terminate processes and threads in response to requests from the runtime subsystem 240. More specifically, in an embodiment the runtime subsystem 240 can request the execution of threads and the session core 244 can send requests to the executive of the kernel 218 to allocate memory for the threads and schedule time for them to be executed.

Continuing with the description of FIG. 2, in an embodiment the session core 244 can include a graphics display interface 246 (GDI) and an input subsystem 252. The input subsystem 252 in an example embodiment can be configured to receive user input from a client 201 via the protocol stack instance associated with the session and transmit the input to the session core 244. The user input can in some embodiments include signals indicative of absolute and/or relative mouse movement commands, mouse coordinates, mouse clicks, keyboard signals, joystick movement signals, etc. User input, for example, a mouse double-click on an icon, can be received by the session core 244 and the input subsystem 252 can be configured to determine that an icon is located at the coordinates associated with the double-click. The input subsystem 252 can then be configured to send a notification to the runtime subsystem 240 that can execute a process for the application associated with the icon.

In addition to receiving input from a client 201, draw commands can be received from applications and/or a desktop and processed by the GDI 246. The GDI 246 in general can include a process that can generate graphical object draw commands. The GDI 246 in this example embodiment can be configured to pass the commands to the remote display subsystem 254 that can instantiate a display driver for the session. In an example embodiment the remote display subsystem 254 can be configured to include virtual display driver(s) that may not be associated with displays physically attacked to the server 204, e.g., the server 204 could be running headless. The virtual display driver in this embodiment can be configured to receive the draw commands and transmit them to the client 201 via a stack instance associated with the session.

Figure 3:
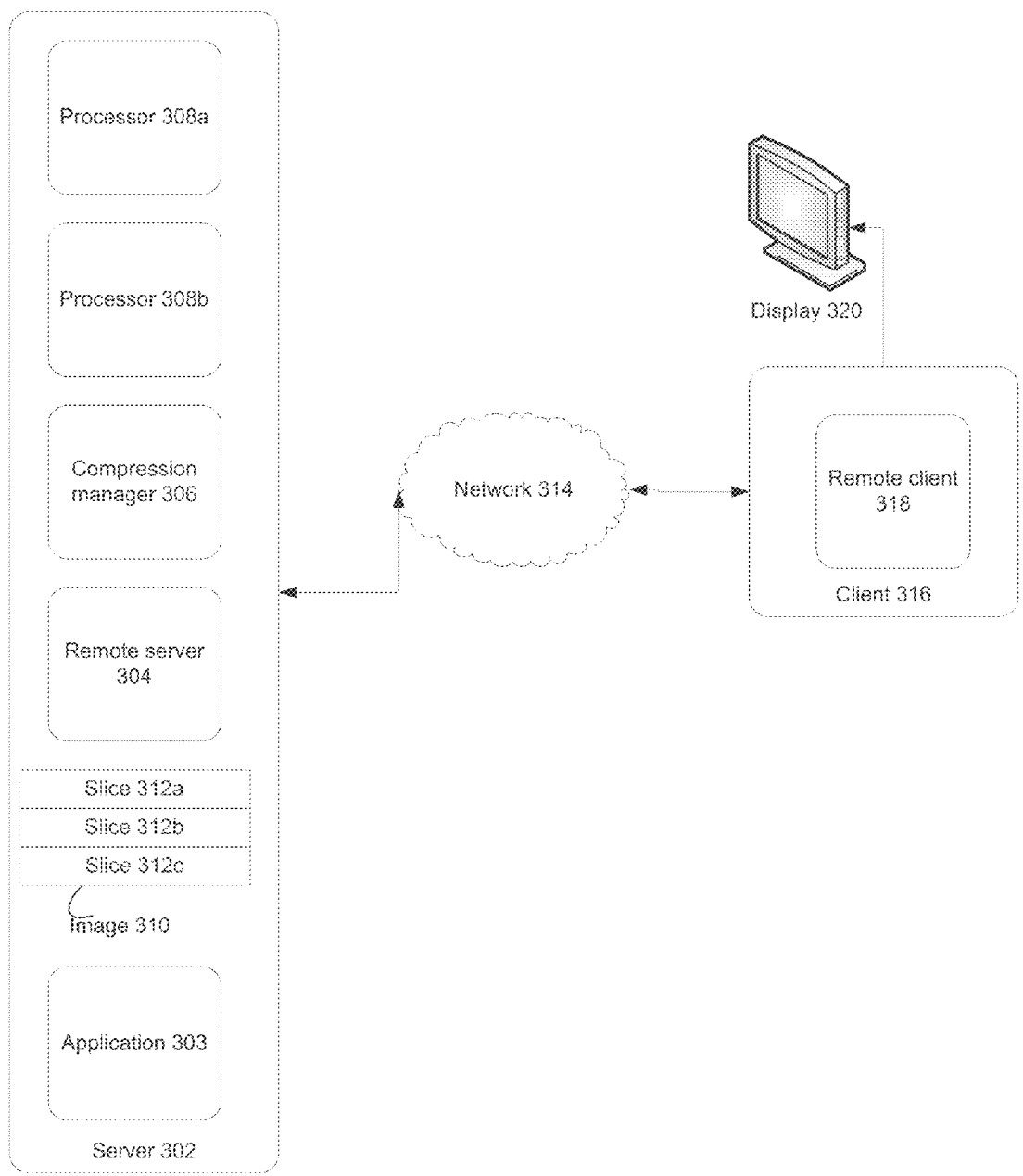
FIG. 3 illustrates a client and server communicating via a remote desktop protocol (RDP) that utilizes multiple-processor image encoding.

FIG. 3 illustrates a client 316 and server 302 communicating via a remote session, wherein the server uses multi-processor compression of images 310 that it sends to the client.

Where the client 316 and server 302 communicate via a remote session that is effectuated by remote server 304 on server 302 communicating with remote client 318 on client 316 across communications network 314. The remote client 318 sends input commands, such as mouse movement or key strokes to the remote server 304, which interprets them and sends the client 318 image data 310 corresponding to the result of that input. For instance, the client 316 may issue mouse movement and clicks to open a video. The server 304 will receive this input information, determine that a video is to be played as a result, and send the resulting images 310, and possibly audio, that corresponds to that video being played to the client 318 for display on display device 320.

The server 302 will often compress the images 310 that it sends to the client 316, so as to conserve bandwidth. On the present system, the server 302 sends each image 310 to a work manager 306, which manages the compression of each image 310 across each of the multiple processors 308 or cores present on the server 302. The work manager 306 will receive an image 310 and partition it into one or more slices 312. Whereas a typical remote session compression algorithm may operate on tiles (e.g. 64×64 pixel squares) or strips (e.g. 1680×2 pixel rectangles), a slice 312 is typically a much larger section of the image 310 (e.g. 1680×128 pixels). The slices 312 may selected so as to avoid any cache thrashing issues for a processor 308. In the course of compression, a slice 312 may be further divided up into tiles or strips, but the slice 312 is the unit that is allocated to a processor 308, so all tiles or stripes within a slice 312 remain allocated to that core.

The work manager 306 maintains a thread associated with each processor 308 that it utilizes to compress the image 310. As the work manager 306 generates slices 312, it dispatches each one to one of the threads. The work manager 306 may use a variety of techniques to maximize the efficiency of thread dispatch, such as by assigning a slice 312 to the first available thread, or queuing a plurality of slices 312 on a thread, so that the thread never lacks for a slice 312 to compress.

When the thread is executed on its corresponding processor 308, the slice 312 is then compressed. In an embodiment, the slice 312 is compressed via a run-length encoding (RLE) compression scheme. Once the slice 312 is compressed, the work manager 306 receives an indication of such. When the work manager 306 has received an indication that each slice 312 in a given image 310 is compressed, it provides the compressed image to the remote server 304, and the remote server 304 transfers it to the remote client 318 across the communications network 314. The remote client 318 receives the compressed image, and directs the client 316 to display the received image on display device 320.

An indication that a slice 312 has been compressed may comprise a pointed to the memory location where the compressed slice 312 resides. In this embodiment, the work manager 306 may order these pointers, such that the first pointer points to the start of the image, the last pointer points to the end of the image, and any pointers in between are correspondingly ordered.

The slices 312 may be completed in any order. It is the work manager 306 that receives these slices 312 in whatever order and, in an embodiment, builds an ordered list of pointers to compressed output buffers of the compressed slices 312. Once all slices 312 for an image have been compressed, the image is considered to be completely compressed.

In an embodiment, the work manager 306 may retrieve each compressed slice 312 and then store the compressed image (composed of those compressed slices 312) in a contiguous range of memory.

In an embodiment, the assembly of the compressed image from the compressed slices 312 is performed by the client. The server sends the client each compressed slice 312 along with some indication both of which image it belongs to and where it belongs within the image, and the client assembles the image from that information. In an embodiment, a server finishes sending one image before sending another, so the information may comprise the total number of slices 312 and which slice 312 the presently sent slice 312 is (such as the second of five total slices 312, or just the second slice 312 where the client has already been informed that there are five total slices 312). In an embodiment, the server may send the client slices 312 from multiple images interleaved, so the indication for each slice 312 may comprise both which image it belongs to and which part of the image it is (e.g. the second of five total slices 312 for image 15).

In an embodiment, the remote server is synchronous. After it dispatches an image to the work manager 306, it blocks synchronously, waiting for the image to be compressed and to receive the output of the compressed image.

In an embodiment, the remote server is asynchronous. The remote server dispatches an image to the work manager 306 and then immediately does further processing, such as parsing received client input or generating a second image for the work manager 306 to compress. It later accepts an asynchronous completion notification from the work manager 306 comprising an indication that the image has been compressed or the compressed image itself.

Figure 4:
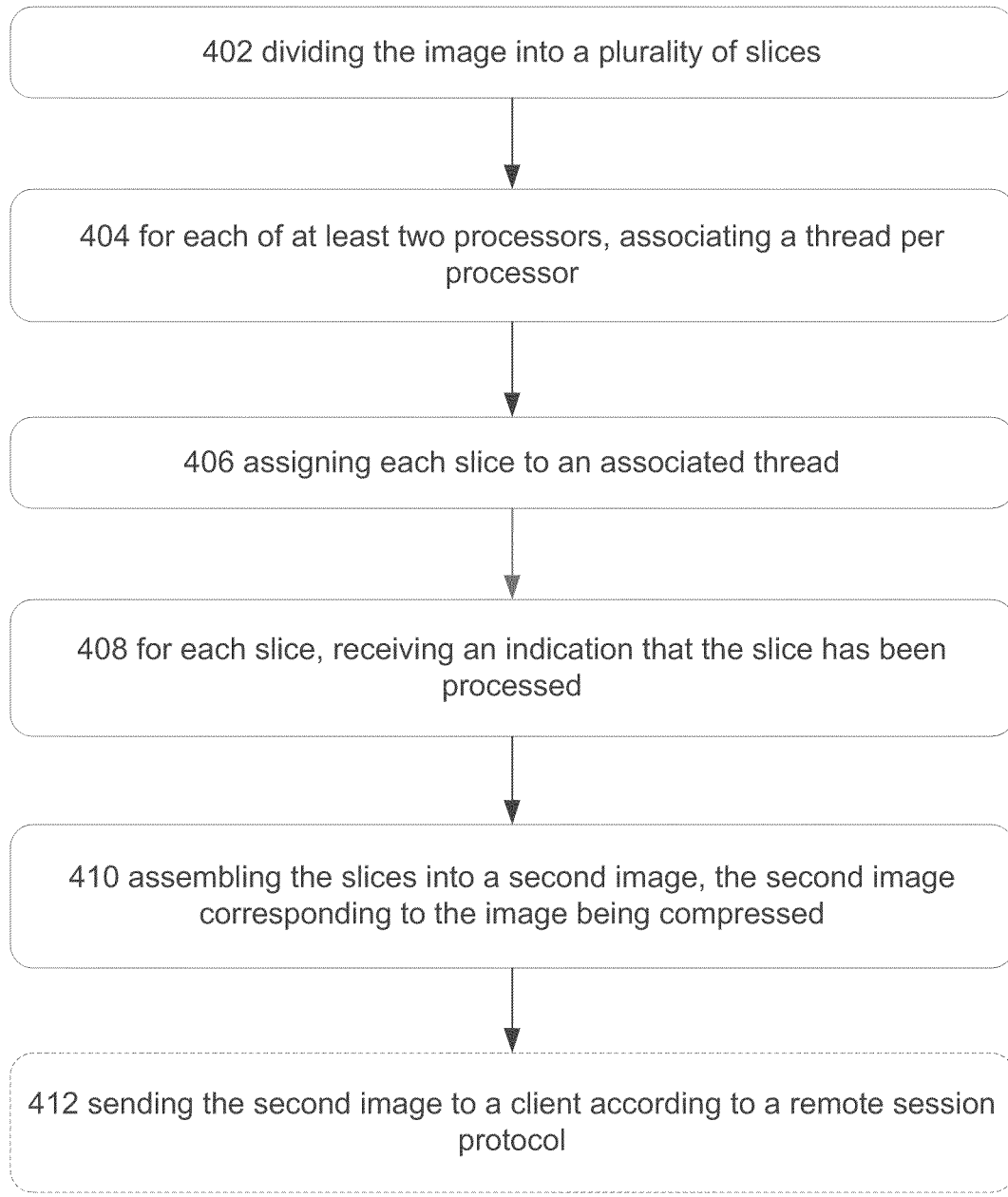
FIG. 4 illustrates exemplary operational procedures for multiple-processor image encoding.

FIG. 4 illustrates exemplary operational procedures for compressing an image on a multi-processor system for transmission via a remote session. A multi-processor system may have a plurality of processing cores or a plurality of discrete processors. In an embodiment, the image comprises a remote session frame, such as an application window or an entire desktop, which may include application windows. In an embodiment, the image comprises a bitmap. In an embodiment, image has a width and a width of each tile is equal to the width of the image.

Operation 402 depicts dividing the image into a plurality of slices. In an embodiment, the image is rectangular and each slice is rectangular as well, and has the same horizontal dimension—or width—as the image.

Operation 404 depicts for each of at least two processors, associating a thread per processor. A work manager may maintain a thread for each processor that it utilizes in compressing images.

Operation 406 depicts assigning each slice to an associated thread. The work manager may use a variety of techniques to maximize the available processor resources. For instance, in an embodiment, assigning a slice to an associated thread comprises assigning a slice to an associated thread corresponding to a processor that has unused processing resources.

Operation 408 depicts for each slice, receiving an indication that the slice has been processed. In an embodiment, an indication that the slice has been processed comprises a pointer to a corresponding compressed output buffer.

Operation 410 depicts assembling the slices into a second image, the second image corresponding to the image being compressed.

Optional operation 412 depicts sending the second image to a client according to a remote session protocol. In an embodiment, the remote session protocol comprises Remote Desktop Protocol (RDP). In an embodiment, the image is received from a remote session stack and the remote session stack blocks synchronously upon providing the image, and operation 412 includes sending the remote session stack an indication that the image has been compressed.

Conclusion

While the present disclosure has been described in connection with the preferred aspects, as illustrated in the various figures, it is understood that other similar aspects may be used or modifications and additions may be made to the described aspects for performing the same function of the present disclosure without deviating therefrom. Therefore, the present disclosure should not be limited to any single aspect, but rather construed in breadth and scope in accordance with the appended claims. For example, the various procedures described herein may be implemented with hardware or software, or a combination of both. Thus, the methods and apparatus of the disclosed embodiments, or certain aspects or portions thereof, may take the form of program code (i.e., instructions) embodied in tangible media, such as floppy diskettes, CD-ROMs, hard drives, or any other machine-readable storage medium. When the program code is loaded into and executed by a machine, such as a computer, the machine becomes an apparatus configured for practicing the disclosed embodiments. In addition to the specific implementations explicitly set forth herein, other aspects and implementations will be apparent to those skilled in the art from consideration of the specification disclosed herein. It is intended that the specification and illustrated implementations be considered as examples only.

What is claimed:

1. A method for compressing an image on a system with a plurality of processors comprising:
    dividing the image into a first slice, a second slice, and a third slice, each slice comprising a portion of the image;
    associating a first thread to execute only on a first processor;
    associating a second thread to execute only on a second processor;
    assigning the first slice to the first thread, and executing the first thread on the first processor because the first thread has been associated to execute only on the first processor;
    assigning the second slice to the second thread, and executing the second thread on the second processor because the second thread has been associated to execute only on the second processor;
    receiving an indication that the first slice has been processed;
    in response to receiving the indication that the first slice has been processed, and in response to determining that the first processor has unused processing resources, assigning the third slice to the first thread, and executing the first thread on the first processor because the first thread has been associated to execute only on the first processor;
    receiving an indication that the second slice has been processed;
    receiving an indication that the third slice has been processed;
    assembling the first, second, and third slices into a second image, the second image corresponding to the image being compressed.

2. The method of claim 1, further comprising:
    sending the second image to a client according to a remote session protocol.

3. The method of claim 1, wherein the image comprises a remote session frame.

4. The method of claim 1, wherein the image has a width and a width of each tile is equal to the width of the image.

5. The method of claim 1 further comprising:
    sending the second image to a client across a communications network via a remote session.

6. The method of claim 5, wherein the remote session comprises Remote Desktop Protocol (RDP).

7. The method of claim 5, wherein the image is received from a remote session stack and the remote session stack blocks synchronously upon providing the image, further comprising:
    sending the remote session stack an indication that the image has been compressed.

8. The method of claim 5, wherein the image is received from a remote session stack, the remote session stack blocking asynchronously upon providing the image, further comprising:
    sending the remote session stack an indication that the image has been compressed.

9. The method of claim 1, wherein the indication that the first slice has been processed comprises a first pointer to a first compressed output buffer, the indication that the second slice has been processed comprises a second pointer to a second compressed output buffer, and the indication that the third slice has been processed comprises a third pointer to a third compressed output buffer, and further comprising:
    ordering a list comprising the first, second, and third pointers to correspond to an order of the slices in the image.

10. The method of claim 1, wherein the image comprises a bitmap.

11. A system for compressing an image, comprising:
    a plurality of processors;
    at least one memory storing computer-readable instructions that when executed on the plurality of processors, cause the system to at least:
        associate a first thread to execute only on a first processor of the plurality of processors;
        associate a second thread to execute only on a second processor of the plurality of processors;
        divide the image into a first slice, a second slice, and a third slice, each slice comprising a portion of the image;
        assign the first slice to the first thread, and execute the first thread on the first processor because the first thread has been associated to execute only on the first processor;
        assign the second slice to the second thread, and execute the second thread on the second processor because the second thread has been associated to execute only on the second processor;
        receive an indication that the first slice has been processed;
        in response to receiving the indication that the first slice has been processed, and in response to determining that the first processor has unused processing resources, assign the third slice to the first thread, and executing the first thread on the first processor because the first thread has been associated to execute only on the first processor;
        receive an indication that the second slice has been processed;
        receive an indication that the third slice has been processed;
        send each processed first, second, and third slices to a client.

12. The system of claim 11, wherein the instructions, that when executed on the plurality of processors, cause the system to at least send each processed slice to a client further cause the system to at least:
    send each slice with a corresponding indication of what part of the image that slice represents.

13. The system of claim 11, wherein the instructions, that when executed on the plurality of processors, cause the system to at least send each processed slice to a client further cause the system to at least:

send the client a compressed image, the compressed image comprising each slice.

14. The system of claim 11, wherein the instructions, that when executed on the plurality of processors, cause the system to at least send each processed slice to a client further cause the system to at least:

send each processed slice to the client via a remote session.

15. The system of claim 14, wherein the remote session comprises Remote Desktop Protocol (RDP).

16. The system of claim 14, wherein the instructions, that when executed on the plurality of processors, cause the system to at least assign a slice to an associated thread further cause the system to at least:

assign a slice to an associated thread corresponding to a processor that has unused processing resources.

17. The system of claim 14, wherein an indication that the slice has been processed comprises a pointer to a corresponding compressed output buffer, and wherein the memory further bears instructions, that, when executed on the plurality of processors, cause the system to at least order a list comprising each pointer to correspond to an order of the slices in the image.

18. The system of claim 14, wherein the image comprises a bitmap.

19. A computer-readable storage device containing computer-readable instructions that when executed on a processor, cause the processor to perform the operations of:

dividing an image into a first slice, a second slice, and a third slice, each slice comprising a portion of the image;
associating a first thread to execute only on a first processor;
associating a second thread to execute only on a second processor;
assigning the first slice to the first thread, and executing the first thread on the first processor because the first thread has been associated to execute only on the first processor;
assigning the second slice to the second thread, and executing the second thread on the second processor because the second thread has been associated to execute only on the second processor;
receiving an indication that the first slice has been processed;
in response to receiving the indication that the first slice has been processed, and in response to determining that the first processor has unused processing resources, assigning the third slice to the first thread, and executing the first thread on the first processor because the first thread has been associated to execute only on the first processor;
receiving an indication that the second slice has been processed;
receiving an indication that the third slice has been processed;
sending the first, second, and third processed slices to a client via a remote session across a communications network.

* * * * *